US 6,561,522 B1

(12) United States Patent
Radelet et al.

(10) Patent No.: US 6,561,522 B1
(45) Date of Patent: May 13, 2003

(54) SEALING ARRANGEMENT

(75) Inventors: Christiaan Radelet, Scherpenheuvel (BE); Valere Buekers, Zelem-Halen (BE); Dirk Deroost, Baal (BE)

(73) Assignee: Tyco Electronics Raychem N.V. (BE)

( * ) Notice: Subject to any disclaimer, the term of this patent is extended or adjusted under 35 U.S.C. 154(b) by 0 days.

(21) Appl. No.: 09/601,920

(22) PCT Filed: Jan. 26, 1999

(86) PCT No.: PCT/GB99/00264

§ 371 (c)(1),
(2), (4) Date: Aug. 9, 2000

(87) PCT Pub. No.: WO99/41531

PCT Pub. Date: Aug. 19, 1999

(30) Foreign Application Priority Data

Feb. 11, 1998 (GB) ............................................. 9802761

(51) Int. Cl.[7] ............................................. F16J 15/02
(52) U.S. Cl. .................. 277/628; 277/644; 277/314; 277/608; 277/612; 277/626
(58) Field of Search .................. 277/314, 602, 277/628, 604, 644, 608, 612, 614, 626, 647, 910; 220/254, 304, 326, 288, 542

(56) References Cited

U.S. PATENT DOCUMENTS

| | | | |
|---|---|---|---|
| 2,475,836 A | | 7/1949 | Henricksen |
| 2,764,311 A | * | 9/1956 | Blackman .................... 277/602 |
| 4,192,520 A | | 3/1980 | Hasegawa |
| 4,201,306 A | * | 5/1980 | Dubois et al. ............... 220/304 |
| 5,050,764 A | | 9/1991 | Voss |
| 5,074,428 A | * | 12/1991 | Wildfeuer .................... 220/322 |
| 5,169,161 A | * | 12/1992 | Jones .......................... 277/608 |
| 5,207,345 A | * | 5/1993 | Stewart et al. ............... 220/304 |
| 5,687,975 A | * | 11/1997 | Inciong ....................... 277/591 |
| 5,746,359 A | * | 5/1998 | Stanek et al. ................ 220/304 |
| 5,862,936 A | * | 1/1999 | Johanson ..................... 220/304 |

FOREIGN PATENT DOCUMENTS

| | | |
|---|---|---|
| DE | 1297028 B | 6/1969 |
| GB | 547 066 A | 2/1947 |

OTHER PUBLICATIONS

Copy of International Search Report.
Copy of International Preliminary Examination Report.
Copy of Invitation to Restrict or to Pay Additional Fees.
Copy of Notification Concerning Informal Communications with the Applicant.

* cited by examiner

*Primary Examiner*—Anthony Knight
*Assistant Examiner*—E Peavey
(74) *Attorney, Agent, or Firm*—Myers Bigel Sibley & Sajovec

(57) ABSTRACT

A sealing arrangement is provided including a first housing and a second housing and a sealing member positioned therebetween. In various embodiments, one housing includes a channel shaped portion and the other housing includes a tongue shaped portion movable in an axial direction into the channel shaped portion to compress the sealing member therebetween in a transverse direction relative to the axial direction. In further embodiments, both housings include a channel shaped portion and the sealing member extends into each channel shaped portion and is compressed within each channel shaped portion in a transverse direction.

20 Claims, 4 Drawing Sheets

Figure 4A:
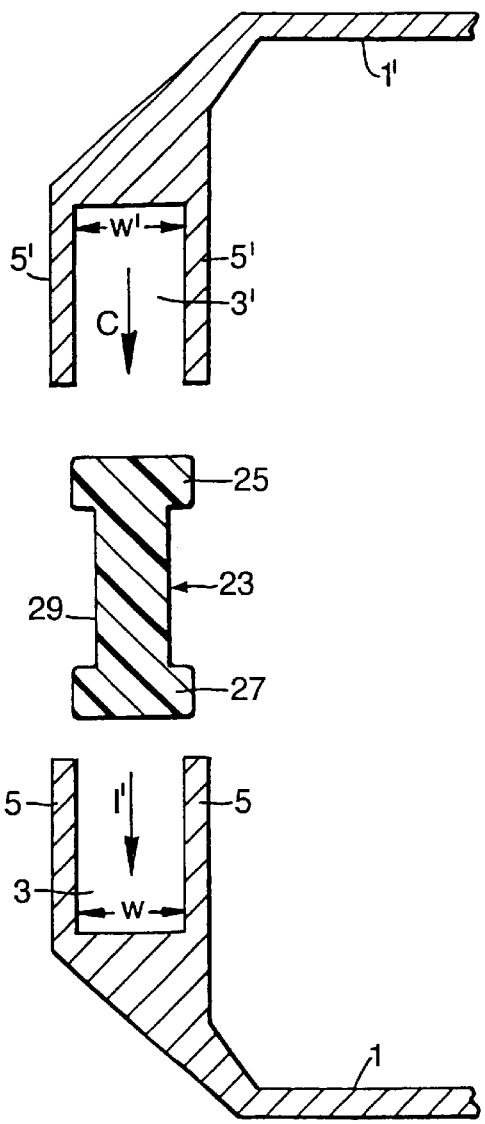

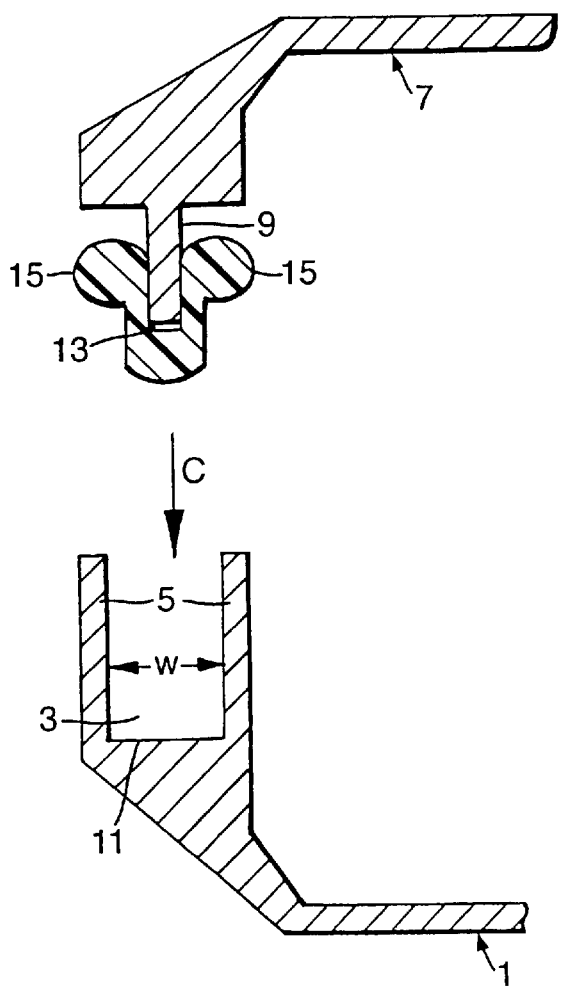
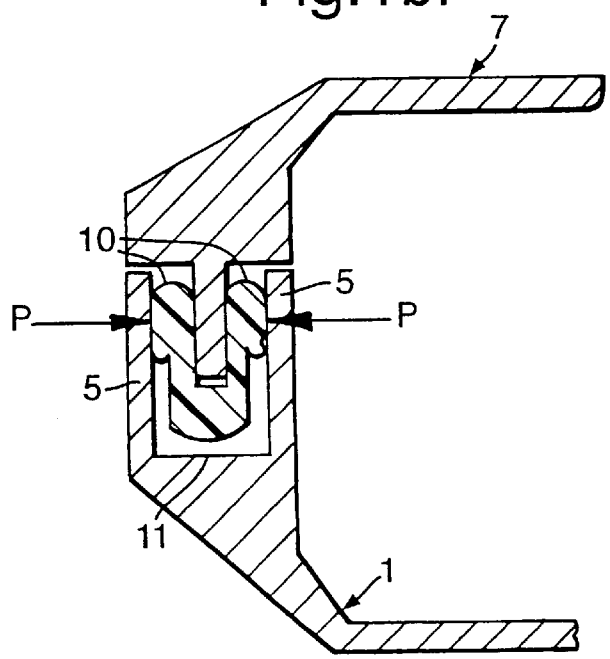
Fig.1a.
Fig.1b.

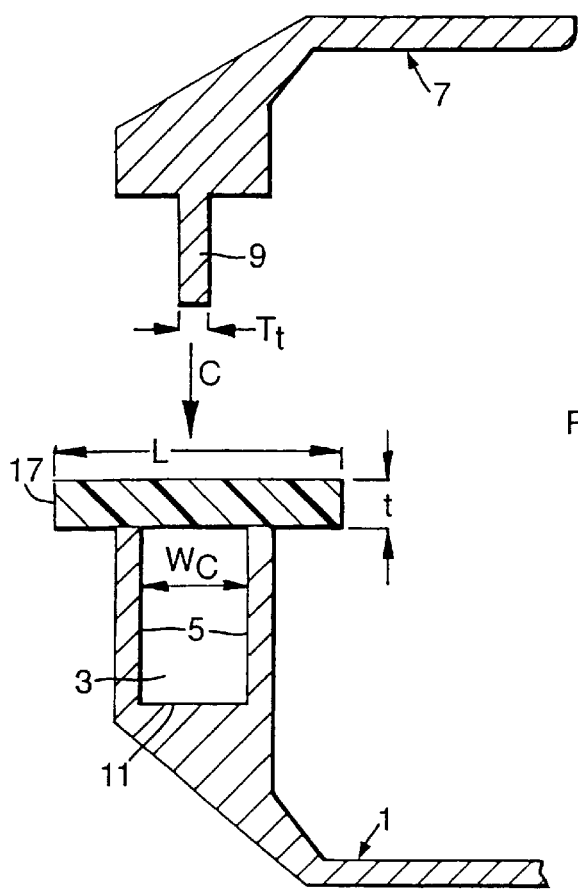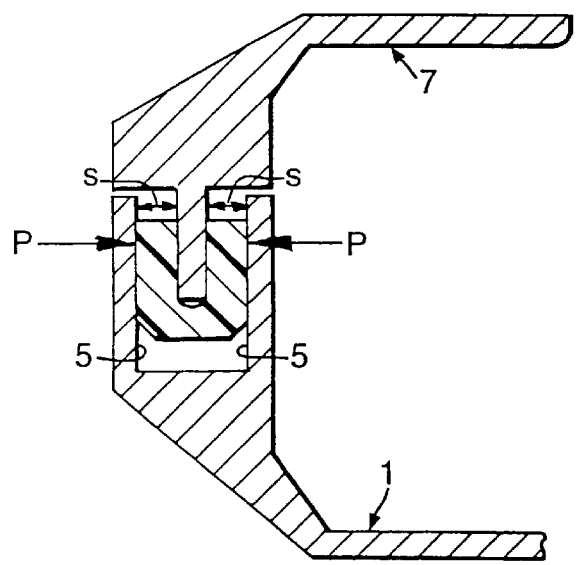

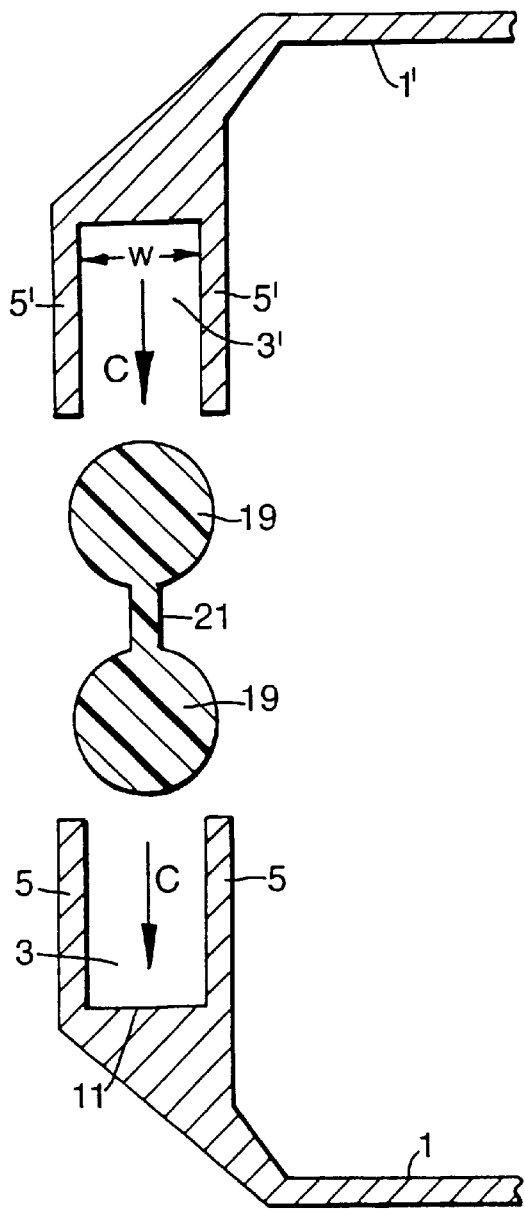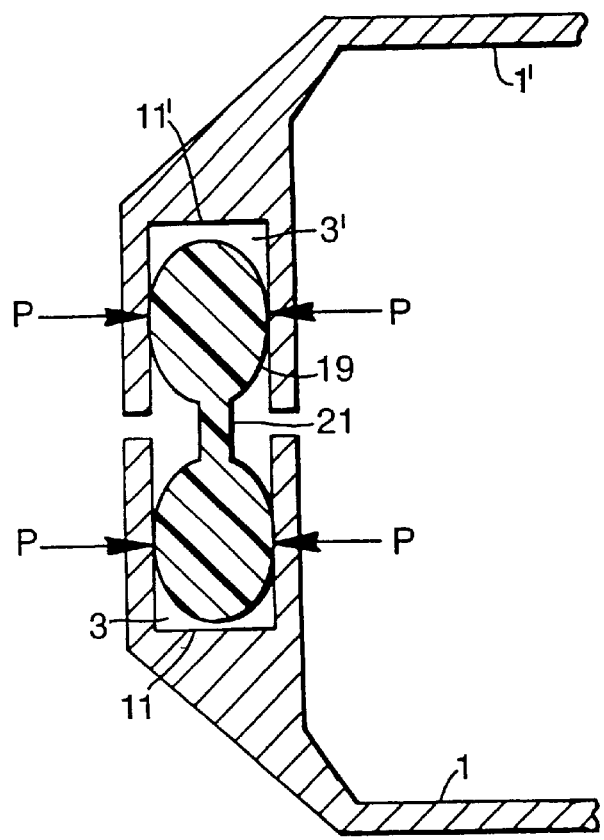

SEALING ARRANGEMENT

This invention relates to a sealing arrangement and method, which may be used for forming a seal between two surfaces, for example in a protective housing to protect the contents of the housing from contamination, or within a domestic appliance or other device to prevent fluids from penetrating into parts where they would cause nuisance or damage.

Many kinds of seal are known for forming a seal between two surfaces. Typically a sealing member is positioned between two surfaces, and the surfaces are then brought towards each other, causing the sealing member to be compressed and thereby urged into sealing engagement with both of the surfaces. Generally seals of this type fall into two main categories. The first category are so-called axial seals, in which the sealing member is generally compressed in the same direction as the direction of relative movement of the two surfaces being brought towards each other. The second category are so-called transverse seals (often radial seals depending on the orientation of the parts), in which the sealing member is generally compressed in a direction transverse (often perpendicular) to the direction of relative movement of the two surfaces which are being brought towards each other. The present invention relates to a transverse seal.

One example of a known transverse sealing arrangement is a radial seal applied as an O-ring between a base and a dome shaped housing in a closure for telecommunications cables. The base has a generally circular flat surface and an upstanding rim around its edge. The O-ring is shaped to fit around the outside of the rim. The dome shaped housing has a diameter which is larger than that defined by the rim of the base, but smaller than that defined by the inner circumference of the O-ring when in position on the base, and in an uncompressed state. Therefore, as the dome shaped housing is brought down onto the base, the ring is compressed radially inward between the housing and the rim. In this prior art, as in most transverse (e.g. radial) seals, the direction of compression (in this case radially inward) is perpendicular to the direction of relative movement of the surfaces that are being brought towards each other (in this case axial movement between the base plate and the housing).

Another example of a known radial seal is a V-shaped seal. This may be arranged, for example on the base and dome shaped housing structure described above, so that one arm of the "V" seal is secured to the inner wall of the rim of the base, and the closed tip of the "V" seal points towards the approaching dome shaped housing. As the dome shaped housing is brought towards the base, the other arm of the "V" seal is urged into sealing engagement with the dome shaped housing.

Sealing arrangements in which one of the surfaces being sealed comprises a channel shaped portion, and sealing arrangements in which the two surfaces being sealed comprise tongue and groove shaped portions, are known. WO-A-96/18836 (N.V. Raychem S.A.), for example, describes a seal comprising a flexible tubular, elastomeric article having a series of surface depressions on its outer surface which generally contain or/and are coated with a sealing gel. In one example the housing parts comprise a channel and a lid, and the seal is shaped and sized so that it initially is a loose fit within the channel. The lid is brought towards the channel causing the elastomeric article to deform so that the gel forms a seal against the floor of the channel and the lid, and may also seal against the side walls of the channel. This therefore forms both an axial seal (between the floor of the channel and the lid), and a radial seal (if the gel also seals against the side walls). As another example, WO-A-96/09483 describes a tubular layer of a gel sealant on a flexible tubular carrier used as a sealing member. It may be compressed in any convenient manner, e.g. in a tongue and groove joint. In one example shown, the seal is placed loosely in a groove, and then a tongue shaped portion introduced to compress the seal.

We have discovered a new sealing arrangement, which in its various embodiments has several advantages over sealing arrangements known hitherto.

A first aspect of the present invention provides a method of forming a seal between two housing parts, at least a first one of which comprises a channel shaped portion; the method comprising:

i) providing a sealing member that prior to sealing has a transverse dimension that is greater than a transverse dimension of the channel shaped portion;

ii) positioning the sealing member adjacent to the channel shaped portion; and iii) moving the second housing part relative to the channel shaped portion, causing the sealing member to be inserted into the channel shaped portion of the first housing part, and thereby compressed in its transverse dimension.

A second aspect of the present invention provides a sealing arrangement comprising:

i) two housing parts, at least a first one of which comprises a channel shaped portion;

ii) a sealing member, that prior to sealing has a transverse dimension greater than a transverse dimension of the said channel shaped portion;

iii) whereby, in use, in order to effect a seal, the second housing part can be moved relative to the said first housing part causing the sealing member to be inserted into the channel shaped portion of the first housing part, and thereby compressed in its transverse dimension.

In preferred embodiments of the invention, the first and second housing parts can be cylindrical. The sealing member is preferably annular. For these embodiments, the transverse compression of the sealing member is specifically radial compression. The first and second housing parts may also be linear, i.e. made of shapes with substantially straight edges. For these embodiments, the sealing member(s) is preferably also straight, with or without bends or rounds to accommodate corners of the housing.

The sealing member may, but need not be, inserted into the channel shaped portion of the first housing member such that it contacts the base of the channel shaped portion. If it does do so, then there may be an axial seal formed between the channel base and the sealing member, in addition to the transverse seal formed by compression of the sealing member in its transverse dimension. However, a major advantage of the present invention is that no axial compression is required for good sealing action.

Preferably the channel shaped portion is defined by an opening, two side walls and a base. Preferably the side walls extend substantially perpendicularly to the base, and the channel shaped portion is substantially uniform in its width (i.e. the distance between the side walls is substantially uniform) along its depth, and also along its length.

Preferably the sealing member is inserted into the channel shaped portion so that the nearest point of contact between the sealing member and the inner side wall of the channel shaped portion is at least 1 mm from the opening of the channel shaped portion, preferably at least 3 mm, especially preferably at least 5 mm, or even at least 10 mm or more, depending on the overall dimensions of the parts. This advantageously allows for some axial movement (i.e. in the opening/closing direction) between the housing parts, during operation, without any loss of sealing, since the sealing member can move the maximum 1, 3, 5, or even 10 mm before sealing contact is lost. It also allows a less strong clamping system to be used to hold the housing parts together, compared to the case where the point of sealing between the sealing member and the inner wall of the channel shaped housing is at the opening of the channel, and compared to longitudinal seals, where any relative longitudinal movement between the housing parts would reduce the seal formed.

The second housing part is preferably moved towards the first housing part in a direction that is substantially perpendicular to the said transverse dimension of the sealing member, and preferably in a direction that is substantially perpendicular to the direction of compression of the sealing member.

An advantage of the transverse sealing arrangement of the present invention (e.g. where the direction of relative movement of the housing parts is perpendicular to the direction of compression of the sealing member) is that relatively low closing forces are to be applied and maintained by the closing system (e.g. a clamp or latches), compared to axial sealing arrangements (in which the direction of relative movement of housing parts is the same as the direction of compression of the sealing part). This is because in transverse sealing arrangements, the seal compression is not in the same direction as the closing direction of the housing parts.

In preferred aspects of the invention, the second housing part comprises a tongue shaped portion, which in the method of the invention is inserted into the channel shaped portion in order to insert the sealing member into the channel shaped portion of the first housing part. The arrangement is then a tongue and groove arrangement.

In the sealing arrangement of the present invention the critical dimensions for ensuring a good seal are the relative dimensions of the channel shaped portion and the sealing member; and for embodiments where the second housing part is a tongue shaped member, the thickness of the tongue. The sealing arrangements according to the invention allow for a slight relative movement of both housing parts without loss of compression of sealing. Thus closing, and manufacture of the parts that hold the housing part together are less craft sensitive, and less dependent on manufacturing and design tolerances. Therefore manufacture of the housing parts is much cheaper.

Preferably, as the sealing member is compressed, it is compressed into sealing contact with both inner side walls of the channel shaped portion of the first housing part, i.e. with two surfaces of the first housing part. Especially preferably, as the sealing member is compressed it is also urged into sealing contact with two surfaces of the second housing part. For example, where the second housing part comprises a tongue shaped member, the sealing member is preferably compressed so that it extends within the passage between the tongue and the groove (channel), and seals to both side surfaces of the tongue, and both inner walls of the groove. Similarly, where in another embodiment, both housing parts comprise channel shaped members, the sealing arrangement is preferably arranged to be compressed into sealing engagement with both inner walls of each channel shaped portion. In these embodiments, and in all the specific embodiments described below with reference to the drawings there are at least two sealing barriers between the upper and lower (first and second) housing parts, providing extra reliability against accidental damage.

Since the seals are transverse rather than axial, there is no need to put any significant force on the housing parts to push them together in the axial direction. This means that those parts of the housing, which in an axial design would need to be reinforced, need not be reinforced. This results in a simpler, cheaper design.

One embodiment of the invention comprises a first housing part that has a mating surface that comprises a channel shaped portion; a second housing part that has a cooperating mating surface comprising a tongue which can fit loosely into the channel; and a sealing member that is generally "U" or "V" shaped in cross-section, with an O ring portion at the tip of each arm of the "U" or "V". The sealing member is shaped so that it can be positioned over the tongue of the second housing member, and inserted into the channel of the first housing member, by moving the tongue of the second housing part into the channel of the first housing part. Prior to insertion the O-ring seals, at the tip of each arm of the "U" or "V", project laterally beyond the edges of the opening of the channel, and when inserted, they are therefore radially compressed. They make contact with both inner walls of the channel of the first housing part, and both outer walls of the tongue of the second housing part. Therefore they make contact with two surfaces on each of the housing parts.

In another embodiment according to the invention, the first and second housing parts are as described above, but the sealing member is a generally flat sheet having a thickness greater, preferably at least 10% greater than the nominal gap between tongue and channel, (i.e. greater than 10% of ((width channel-thickness tongue)/2)), more preferably at least 20% greater, or even 50% greater, than the said nominal gap, for certain materials. The flat sealing member is positioned over the opening of the channel, and the tongue brought towards it to urge it into the channel, and thereby compress it between the outer walls of the tongue and the inner walls of the channel. The sealing member contacts both inner walls of the channel, and both outer walls of the tongue. Therefore the sealing member contacts two surfaces on each of the housing parts.

In both the above embodiments using tongue and groove shaped housing parts, a single sealing member extending around the tongue shaped portion is used. In both cases, prior to insertion in the channel, the overall transverse dimension of the sealing member is greater than a transverse dimension of the channel. In the first case, for the "U" or "V" shaped sealing member, with an O-ring seal at the tip of each arm of the "U" or "V" the distance from the extreme outward facing side of one O-ring seal, to the extreme outward facing side of the other O-ring seal is greater than a width of the channel. In the second case, for the flat sheet sealing member, the width of the sealing member, prior to insertion in the channel is greater than the width of the channel.

For tongue and groove shaped housing parts, a critical feature is the width of the transverse gap (i.e. the gap to the side of the tongue) between the tongue and groove (channel) relative to the dimension of the sealing member that will be positioned in that gap.

A third aspect of the present invention therefore provides a method of forming a seal between a first channel shaped housing part, and a second tongue shaped housing part, the method comprising:

i) providing one or more sealing member(s), that prior to sealing have a dimension greater than any transverse gap(s) between tongue and channel shaped housing parts;

ii) positioning the sealing member(s) in the gap between the tongue and the channel shaped housing parts, by moving the tongue shaped housing part relative to the channel shaped housing part, causing the sealing member to be compressed between the tongue shaped housing part, and the channel shaped housing part.

A fourth aspect of the present invention provides a sealing arrangement comprising:

i) a first channel shaped housing part and a second tongue shaped housing part; and ii) one or more sealing members, that prior to sealing have a dimension greater than any transverse gap(s) between the tongue shaped housing part and the channel shaped housing part;

whereby, in use, in order to effect a seal, the tongue shaped housing part can be moved relative to the channel shaped housing part, causing the sealing member(s) to be inserted into the gap(s) between the tongue shaped housing part and the channel shaped housing part, and thereby compressed.

The third and fourth aspects of the invention include the two tongue and groove embodiments described above. For the embodiment comprising a "U" or "V" shaped sealing member with O-ring seals at the tip of each arm of the "U" or "V", said dimension of the sealing member that is greater than any gap between the tongue and channel is the width of each of the O-ring seals. For the embodiment comprising a flat sheet sealing member, the said dimension of the sealing member that is greater than any gap between the tongue and channel is the thickness of the sheet.

The third and fourth aspects of the invention also include other embodiments. For example, the use of two separate sealing members (e.g. O-ring or strip sealing members) urged into the gaps on respective sides of the tongue, but not beneath the tongue. In this case the width of each sealing member would be greater than the width of the respective gap between the channel and tongue. The separate sealing members could, for example, be pre-secured to the tongue shaped sealing member.

Various preferred features of the first and second aspects of the invention also apply to the third and fourth aspect of the invention.

In other embodiments according to the invention both housing parts comprise channel shaped portions and the sealing member extends into both of the channels, and is transversely compressed into sealing engagement with both walls of each channel as the housing parts are brought towards each other. In one embodiment the sealing member, in cross-section, is generally dumbbell shaped, comprising two rib-shaped seals carried at either end of a central, preferably rigid, carrier strip. The sealing ribs have a transverse dimension greater than a transverse dimension of the channel. The channel shaped portions of the two housing parts, may or may not be identical or similar in shape and size. Similarly, the two rib-shaped seals carried at either end of a central carrier strip in the dumbbell shaped sealing member may or may not be identical or similar in shape and size.

In another embodiment, the sealing member, in cross-section, is generally "I" shaped, the top and base of the "I" being longer than a transverse dimension of the channels and thus providing the sealing contact to both inner walls of each channel. The stem of the I acts as a carrier for the sealing top and base of the "I". Preferably the total surface area of contact of the sides of the top and base of the "I" with the channel shaped portions of the housing is less than the surface area of the stem of the "I" which is exposed to the either internal or external pressure within the housing. This results in the contact pressure always increasing more than the applied pressure. Therefore applying either an internal or an external pressure to the sealing member will increase the contact force on the sealing surfaces (the sides of the top and base of the "I"), i.e. the I shaped embodiment of the invention advantageously self seals when exposed to over-pressure or under-pressure from within the housing. The contact pressure is also enhanced by the fact that the top and base of the "I" of the seal are initially compressed. The self-sealing nature of the "I" shaped sealing member embodiment is also described later in relation to the specific examples and drawings.

Examples of materials suitable for use as the sealing member of the present invention include plain rubbers, e.g. nitrile rubber, silicon rubber, and EPDM; rubber foam, e.g. closed cell EPDM, silicon; self lubricating rubber, e.g. silicon rubber; gel coated rubber, gel impregnated foam, mastics and gel with or without a carrier. Gels have various advantages, for example they can be highly conformable at room temperature since they can have an almost liquid-like flexibility that allows them to conform to the substrate to be sealed. They have a cross-linked structure which gives them elasticity, cohesive strength, and form stability. The cross-linked structure may result from cross-linking chemical bonds, as in the case of a silicone or polyurethane gel, or it may result from the formation of crystalline regions as in the case of thermoplastic gels such as those based on block copolymers. In any case, the gel will comprise some form of three-dimensional polymer network, extended by means of an oil or other material. Gels are disclosed in U.S. Pat. No. 4,600,261, the disclosure of which is incorporated herein by reference.

Examples of materials suitable for the housing parts include mainly polymers and metal but also composite or ceramic types of materials.

The housing parts and sealing members may be any suitable shape according to the application. For example a circular base housing part and a dome shaped housing part may each have generally annular mating surfaces, and be used in conjunction with a generally annular sealing member. For a generally box shaped housing, housing parts with substantially straight mating surfaces may be used, in conjunction with either several generally straight elongate sealing members along one or more edges, or a generally annular sealing member, bent to form corners to fit the box shape. Thus where it is specified that the sealing member may have a particular cross-sectional shape, e.g. "V" or "I" or dumbbell, this may apply to a generally straight sealing member, or to a generally annular sealing member.

Figure 4B:
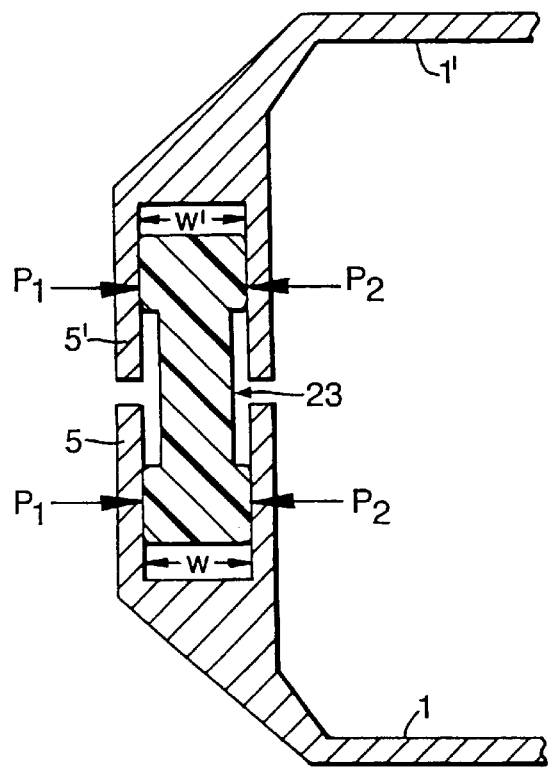
Figure 5A:
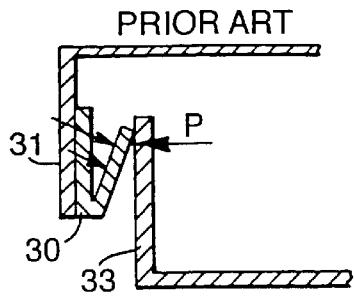
Figure 5B:
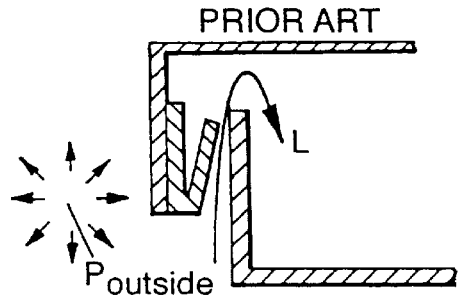

Embodiments of the present invention will now be described, by way of example, with reference to the accompanying drawings, wherein:

FIGS. 1a and 1b are side sectional views through part of a closure including a first embodiment of the invention, in its open and closed position respectively;

FIGS. 2a, and 2b, 3a and 3b, and 4a and 4b are respectively side sectional views through part of a closure including three further embodiments of the invention, each in its open and closed position respectively; and FIGS. 5a and 5b are side sectional views of part of a prior art closure showing the effect on the seal of excess pressure within the closure, and under-pressure within the closure, respectively.

Referring now to the drawings, FIG. 1a shows the housing parts 1, 7 and sealing member 15 before they are brought together, and closed by moving them relative to each other in the closing direction indicated by arrow C. In FIG. 1a can be seen part of a first housing part 1 having a channel shaped portion 3, with inner walls 5 extending substantially perpendicularly to a base 11. The transverse dimension (width "w") of the channel shaped portion 3 is defined as the distance between inner walls 5. The second housing part 7 comprises a tongue shaped portion 9, which is long enough to extend into the channel 3 when the housing parts are brought together, but not to reach the base 11 of the channel. Positioned on the tongue 9 is a sealing member 13 that is generally "U" or "V" shaped in cross-section, having an O-ring type seal at the tip of each arm of the "U" or "V". The transverse dimension of the sealing member 13, measured across from the lateral extreme of one O-ring to the lateral extreme of the other O-ring, prior to insertion into the channel shaped portion, is greater than the width "w" of the channel shaped portion 3.

FIG. 1b shows the part of FIG. 1b once the two housing parts 1 and 7 are brought together. The O ring seals 15 have been compressed in their transverse dimension between the inner walls 5 of channel shaped portion 3, and the outer walls 10 of tongue 9. There is therefore double contact with each housing part 1, 7. The contact pressure resulting is indicated by the arrow P. As can be seen, the contact pressure P is perpendicular to the direction of relative movement C of the housing parts 1 and 7, i.e. the seal formed is a transverse seal. The sealing member 13 does not contact the base 11 of the channel shaped portion 3.

FIGS. 2a and 2b show another embodiment according to the invention, respectively before and after closure of the housing parts 1, 7. Housing parts 1 and 7 are identical to those in FIG. 1, and like parts are given like reference numerals. In this case, the sealing member is in the form of a flat sheet, having a transverse dimension "I" which is greater than the width of the channel shaped portion 3 . It also has a thickness "t" which is greater than the nominal or average separation "s" between each outer wall of tongue 9 and its respective facing inner wall 5 of the channel shaped portion 3 (see FIG. 2b), i.e. (t>(Wc−Tt)/2 where Wc=width of channel; Tt=Thickness of Tongue). (This means that when the tongue 9 is inserted into channel 3, the sealing member 17 is compressed and creates a contact pressure as indicated by arrow P).

FIGS. 3a and 3b show another embodiment, again respectively before and after closure of housing parts. In this case the first housing part 1 is as in FIGS. 1 and 2, and the second housing part 1' is a mirror image thereof; i.e. it is also channel shaped. Parts in the mirror image second housing part 1' have been given like reference numerals to those in the first housing part 1, but with a prime notation. In this embodiment the sealing member is, in cross-section, generally dumbbell shaped, comprising two O-ring, or rib shaped seals 19 carried on a central rigid carrier strip 21. The transverse dimension (in this case the diameter of the O-rings seals) is greater than the width "w" defined between the walls 5 of channel shaped portion 3. The rigid carrier 21 may comprise a stiff polymer, e.g. PP, PE, PVD, ABS, PA, a Hard rubber e.g. nitrile, EPDM, rubber of 70 Shore A or more; or a metal, e.g. Aluminium, Steel, Stainless steel, brass or any other alloy. When sealing is required the sealing member is positioned between the housing parts, and the parts are urged closed as indicated by the arrows C in FIG. 3a. Each O-ring 19 is compressed in its transverse direction, to generate a contact pressure P as indicated by the arrows in FIG. 3b. As before the sealing rings 19 do not contact the base 11, 11 ' of either channel 3, 3'.

FIGS. 4a and 4b show another embodiment. The housing parts 1, 1' are identical to those of FIG. 3, and like parts are given like reference numerals accordingly. In this case the sealing member 23 is generally "I" shaped in cross-section, comprising a top 25, a base 27 and a stem 29. The length of both the top 25 and the base 27 are substantially the same, and are greater than the widths w and w' defined between the walls 5 and 5' of each of channel shaped portions 3 and 3'. Thus when the second housing part 1' is closed towards the first housing part 1 as indicated by the arrow C, then the sealing member 23 is urged into the channel shaped portion 3 as indicated by the arrow I. Since the initial length of the top 25 and base 27 of the I shaped sealing member is greater than the width "w" of each of channel shaped portions 3 and 3', a contact pressure is generated, as shown by arrows P1 and P2 in FIG. 4b. The contact pressure is on both walls 5, 5' of both housing parts 1, 1'. There is therefore double contact to each housing part. This "I" shape seal is particularly advantageous since if there is either over or under pressure from within the housing it will result in an extra contact force/pressure in 1 direction, providing extra sealing peformance. For example, if there is overpressure, i.e. higher pressure inside the housing than outside, it will act on the stem of the I to the right in the figure. This will cause the contact pressures P1, i.e. between the walls 5, 5' to the left of the figure, and the corresponding contact surfaces of the top and base of the I of the sealing member to increase. Similarly, if there is under pressure within the housing, i.e. if the pressure outside the housing is greater than the pressure inside the housing then there will be a corresponding increase in the contact pressures P2, i.e. between the walls 5, 5' to the right of FIG. 4 and the corresponding sealing member contact surfaces.

The extra contact generated on the sealing surfaces of the sealing member, generated if there is an internal or external pressure acting on the sealing member, described above with reference to the "I" shaped sealing member of FIG. 4, would also apply to the dumbbell shaped embodiment of FIG. 3 provided the surface area of the stem is greater than the sum of the contact surfaces of the upper and lower sealing ribs.

This self sealing provided by the embodiment of FIG. 4 is in contrast to the situation with a prior art V shaped seal 30 used between a rim 31 on a base and the outer surface of a dome shaped housing 33, and referred to earlier in the specification. The prior art situation is shown in FIGS. 5a and 5b. In the prior art, over pressure, i.e. a higher pressure within the housing than outside, increases the contact pressure P between the housing parts 31, 33 and the sealing member 30. However, under pressure, i.e. a higher pressure outside the housing than inside, cause contact to be lost between one arm of the V shaped seal 30 and the outer wall of the dome shaped housing 33, so a leak path as indicated by arrow L, may occur above a certain pressure level. The prior art type of V-seal is therefore only suitable for applications that are exposed to either external or internal pressure, but not both; the V-shaped seal being oriented appropriately depending on the pressure applied.

Each of the embodiments of FIGS. 1 to 4 is shown in cross-section only. In each case, the mating surfaces could be generally annular, or they could be elongate, e.g. straight. The sealing member would typically be similarly shaped. Where the mating surfaces are annular, the seal formed would also be called be a radial seal.

In each of the embodiments, the housing parts are moved relatively towards each other. This may be achieved by moving the first housing part, the second housing part, or both.

What is claimed is:

1. A method of forming a seal between two housing parts, each of the two housing parts including a channel shaped portion, the method comprising:

i) providing a sealing member that prior to sealing has a transverse dimension that is greater than a transverse dimension of the channel shaped portions;

ii) positioning the sealing member adjacent to one of the channel shaped portions; and iii) moving the second housing part relative to the channel shaped portion of the first housing member, causing the sealing member to be inserted into the channel shaped portion of the first housing part, and thereby compressed in its transverse dimension with substantially no axial compression.

2. A method according to claim 1, wherein the channel shaped portion of the first housing member has an opening, two side walls and a base, and the sealing member is inserted into the channel shaped portion of the first housing member such that the nearest point of contact between the sealing member and the side walls of the channel shaped portion of the first housing is at least 1 mm from the opening of the channel shaped portion of the first housing.

3. A method according to claim 1 wherein the second housing part is moved towards the first housing part in a direction that is substantially perpendicular to the said transverse dimension of the sealing member.

4. A method according to claim 3 further comprising the step of moving the first housing part relative to the channel shaped portion of the second housing member, causing the sealing member to be inserted into the channel shaped portion of the second housing part, and thereby compressed in its transverse dimension.

5. A method according to claim 4 wherein the sealing member comprises a generally dumbbell shaped member having a first and second seal positioned on opposing ends of a central carrier strip and wherein the step of moving the second housing part relative to the channel shaped portion of the first housing member further comprises inserting the first seal into the channel shaped portion of the first housing part, and thereby compressing the first seal in its transverse dimension and wherein the step of moving the first housing part relative to the channel shaped portion of the second housing member further comprises the step of inserting the second seal into the channel shaped portion of the second housing part, and thereby compressing the second seal in its transverse dimension.

6. A method according to claim 5, wherein the channel shaped portions each have an opening, two side walls and a base, and the sealing member is compressed into sealing contact with both side walls of each of the channel shaped portions.

7. A sealing arrangement comprising:
a first housing part which includes a channel shaped portion, the channel shaped portion including first and second sidewalls and a base;
a second housing part including a tongue shaped portion configured to fit between the sidewalls of the channel shaped portion;
a sealing member, that, prior to sealing, has a transverse dimension greater than a transverse dimension of the said channel shaped portion extending between the first and second sidewalls, the sealing member having at least one of a generally "U" shaped or generally "V" shaped cross-section and having at least one of an O-ring or rib sealing portion at an end of each arm of the at least one of a generally "U" shaped or generally "V" shaped cross-section; and
wherein, when the tongue shaped portion is positioned between the first and second sidewalls of the channel shaped portion with the sealing member therebetween, the sealing member is inserted into the channel shaped portion of the first housing part, and thereby compressed in its transverse dimension.

8. A sealing arrangement according to claim 7 wherein the first and second housing parts are generally cylindrical, and the sealing member is generally annular.

9. A sealing arrangement according to claim 7 wherein the sealing member does not contact the base of the channel shaped portion when the tongue shaped portion is positioned between the first and second sidewalls of the channel shaped portion with the sealing member therebetween and the first housing part is positioned abutting the second housing part.

10. A sealing arrangement comprising:
a first housing part including a channel shaped portion, the channel shaped portion including sidewalls and a base;
a second housing part including a tongue shaped portion, the second housing being movable relative to the first housing part in an axial direction to position the tongue shaped portion in the channel shaped portion;
a sealing member positioned between the tongue shaped portion and the channel shaped portion, the sealing member comprising a flat sheet having an uncompressed thickness that is at least about 10% greater than a spacing between a side of the tongue shaped portion and an adjacent sidewall of the channel shaped portion when the tongue shaped portion is positioned in the channel shaped portion, the sealing member further having a transverse dimension relative to the axial direction greater than a transverse dimension of the channel shaped portion prior to insertion of the sealing member between the tongue shaped portion and the channel shaped portion when the tongue shaped portion is positioned in the channel shaped portion; and
wherein the sealing member is compressed in its transverse dimension when the tongue shaped portion is positioned in the channel shaped portion with the sealing member therebetween.

11. A sealing arrangement according to claim 10 wherein the sealing member does not contact a base of the channel shaped portion when the tongue shaped portion is positioned in the channel shaped portion with the sealing member therebetween and the first housing part is positioned abutting the second housing part.

12. A sealing arrangement according to claim 10 wherein the sealing member is positioned between the tongue shaped portion and the sidewalls of the channel shaped portion.

13. A sealing arrangement comprising:
a first housing part having a tongue shaped portion;
a second housing part having a channel shaped portion, the channel shaped portion being defined by sidewalls and a base, the second housing part being movable relative to the first housing part in an axial direction; and
a substantially "U" shaped sealing member configured to receive the tongue shaped portion between arms of the "U" shaped sealing member and having an O-ring type seal at an end of each arm of the "U" shaped sealing member, each O-ring type seal having a dimension in a direction transverse to the axial direction greater than a separation between each outer wall of the tongue shaped portion and its respective facing sidewall of the channel shaped portion when the second housing part is moved relative to the first housing part to position the tongue shaped portion in the channel shaped portion with the sealing member therebetween so as to compress the O-ring type seals in the transverse direction.

14. A sealing arrangement according to claim 13 wherein the sealing member does not contact the base of the channel shaped portion when the second housing part is moved relative to the first housing part to position the tongue shaped portion in the channel shaped portion with the sealing member therebetween so as to compress the O-ring type seals in the transverse direction.

15. A sealing arrangement according to claim 14 wherein, prior to insertion into the channel shaped portion, the transverse dimension of the sealing member measured from a lateral extreme of one of the O-ring type seals to a lateral extreme of the other of the O-ring type seals is greater than a width between the sidewalls of the channel shaped portion.

16. A sealing arrangement according to claim 14 wherein the tongue shaped portion extends beyond a line connecting the lateral extremes of the O-ring type seals.

17. A sealing arrangement comprising:
   a first housing including a channel shaped portion, the channel shaped portion including sidewalls and a base;
   a second housing including a channel shaped portion, the channel shaped portion of the second housing part including sidewalls and a base, the second housing part being movable relative to the first housing part in an axial direction; and
   a sealing member having a dimension in a direction transverse to the axial direction greater than a transverse dimension between the sidewalls of the channel shaped portion of the first housing on a first end adjacent the first housing and having a dimension in a direction transverse to the axial direction greater than a transverse dimension between the sidewalls of the channel shaped portion of the second housing on a second end of the sealing member opposite the first end and adjacent the second housing part, the first end extending into the channel shaped portion of the first housing and being compressed thereby in the transverse direction and the second end extending into the channel shaped portion of the second housing and being compressed thereby in the transverse direction with substantially no axial compression.

18. A sealing arrangement according claim 17 wherein the sealing member, in cross-section, is generally dumbbell shaped, comprising two O-ring seals positioned at opposite ends of a central carrier strip.

19. A sealing arrangement according to claim 18 wherein the central carrier strip is a rigid strip.

20. A sealing arrangement according to claim 17 wherein the sealing member, in cross-section, is generally "I" shaped.

* * * * *